United States Patent
Fujii et al.

(10) Patent No.: US 6,194,491 B1
(45) Date of Patent: Feb. 27, 2001

(54) BIPHENYL EPOXY RESIN, NAPHTHALENE-CONTAINING PHENOLIC RESIN AND ACCELERATOR TRIPHENYLPHOSPHINE/P-BENZOQUINONE

(75) Inventors: Masanobu Fujii, Shimodate; Haruaki Sue, Tsukuba; Shinya Yamada, Tochigi-ken, all of (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 09/166,128

(22) Filed: Oct. 5, 1998

(30) Foreign Application Priority Data

Oct. 3, 1997 (JP) .................................................. 9-271157

(51) Int. Cl.[7] ............................. C08K 3/36; C08L 63/00; C08L 63/02; C08L 63/04
(52) U.S. Cl. .......................... 523/466; 523/427; 523/457; 525/481; 528/153
(58) Field of Search .......................... 528/153; 525/481; 523/427, 457, 466

(56) References Cited

U.S. PATENT DOCUMENTS 4,404,357 * 9/1983 Taylor et al. ...................... 528/153
5,459,223 * 10/1995 Sue et al. ........................... 528/153
5,567,990 * 10/1996 Kawata et al. ...................... 257/788

FOREIGN PATENT DOCUMENTS

| 3-40459 | * | 2/1991 | (JP) . |
| 5-25252 | | 2/1993 | (JP) . |
| 5-125158 | * | 5/1993 | (JP) . |
| 5-160300 | | 6/1993 | (JP) . |
| 5-320291 | * | 12/1993 | (JP) . |
| 6-107772 | | 4/1994 | (JP) . |
| 6-112368 | | 4/1994 | (JP) . |
| 6-256627 | | 9/1994 | (JP) . |
| 8-176277 | | 7/1996 | (JP) . |
| 8-213518 | | 8/1996 | (JP) . |
| 8-311169 | * | 11/1996 | (JP) . |
| 10-17645 | * | 1/1998 | (JP) . |
| 10-25335 | * | 1/1998 | (JP) . |

* cited by examiner

Primary Examiner—Robert E. L. Sellers
(74) Attorney, Agent, or Firm—Antonelli, Terry, Stout & Kraus, LLP

(57) ABSTRACT

An epoxy resin composition comprises (A) a biphenyl epoxy resin, (B) a phenolic resin curing agent having a naphthalene structure, (C) a curing accelerator comprising an addition product of a triphenylphosphine and benzoquinone, and (D) an inorganic filler contained in an amount of 85 to 95% by weight based on the total amount of the composition, and a semiconductor device encapsulated by this resin composition.

9 Claims, No Drawings

BIPHENYL EPOXY RESIN, NAPHTHALENE-CONTAINING PHENOLIC RESIN AND ACCELERATOR TRIPHENYLPHOSPHINE/P-BENZOQUINONE

BACKGROUND OF THE INVENTION

The present invention relates to an encapsulant comprising an epoxy resin composition with good moldability and high reliability in use, and semiconductor devices in which such an encapsulant is applied.

While there is a steady trend toward reduction of size and thickness of semiconductor elements, we can also note a tendency for the number of pins to increase in the elements in line with the enhanced performance of these elements. This has mandatorily narrowed the interval of the outer leads connecting the semiconductor elements to the substrate, making substrate packaging harder to work. As a solution to this problem, it has been proposed to employ the outer shape designated "BGA" (ball grid array package) in place of conventional "SOP" (small outline package) or "QFP" (quad flat package), and certain elements of this outer shape are already in quantity production in some quarters.

BGA allows wide spacing of the soldering balls for joint as these soldering balls are formed at a part or over the whole surface of the backside of an element, so that this outer shape is suited for multi-pin packaging. However, since BGA is designed to apply an encapsulant on one side of a BT (bismaleimide triazine) substrate or a glass-reinforced epoxy substrate, the produced package necessarily has a bimetal structure and is therefore subject to warping due to the difference in coefficient of contraction between the substrate and the encapsulant.

In order to overcome this problem, various proposals have been made, such as combining a polyfunctional epoxy compound with a specific curing agent and/or a curing accelerator (JP-A-8-176277), or mixing the encapsulants differing by more than 20° C. in glass transition temperature (JP-A-8-213518), but none of these proposals have been found satisfactory.

SUMMARY OF THE INVENTION

The present invention is intended to provide an epoxy resin composition for semiconductor encapsulating, which composition has good moldability, high use reliability and also high warping resistance in use for BGA packaging, and semiconductor devices in which such a resin composition is applied as encapsulant.

The present invention provides an epoxy resin composition for semiconductor encapsulation, comprising:

(A) a biphenyl-type epoxy resin represented by the formula (1):

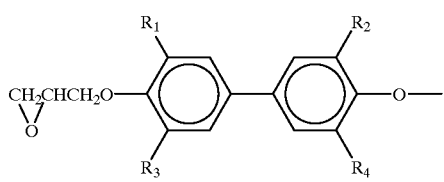

(1)

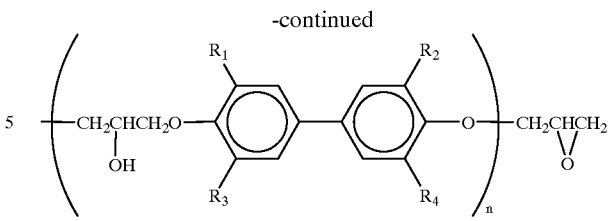

wherein n is an integer of 0 to 6; and $R_1$ to $R_4$ are the same or different and represent independently a hydrogen atom or an alkyl group having 10 or less carbon atoms;

(B) a curing agent represented by the formula (2):

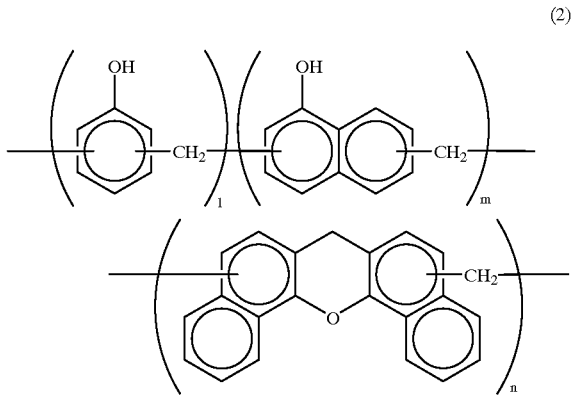

(2)

wherein l and m are each an integer of 0 or greater; and n is an integer of 1 or greater; and preferably $0.03 \leq n/(l+m+n) \leq 0.05$, (C) a curing accelerator which is an addition product of a triphenylphosphine and p-benzoquinone, (D) an inorganic filler contained in an amount of 85 to 95% by weight based on the total amount of the composition.

The present invention also provides a resin-encapsulated semiconductor device comprising a substrate, a semiconductor element mounted on the substrate, and a resin layer encapsulating the semiconductor element-mounted side alone of the substrate, said resin layer being formed with said epoxy resin composition.

DETAILED DESCRIPTION OF THE INVENTION

The epoxy resin composition for semiconductor encapsulation according to the present invention comprises:

(A) an epoxy resin of the formula (1):

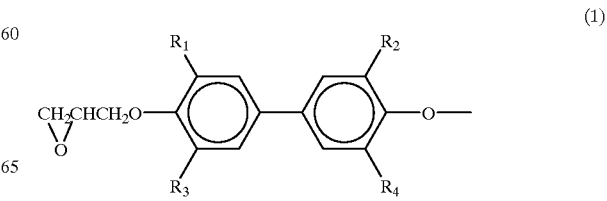

(1)

-continued

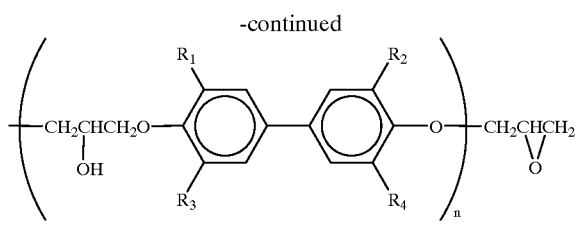

wherein n is an integer of 0 to 6, and $R_1$ to $R_4$ are the same or different and represent independently a hydrogen atom or an alkyl group having 10 or less carbon atoms;

(B) a curing agent of the formula (2):

(2)

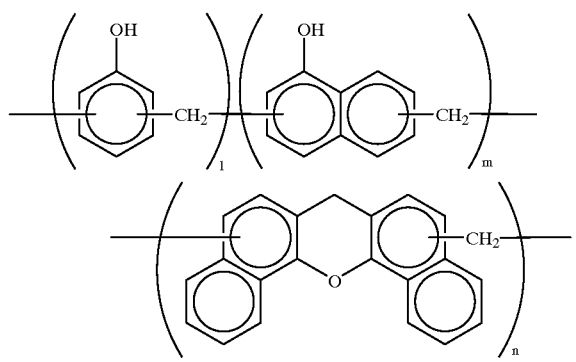

wherein l and m are each an integer of 0 or greater; and n is an integer of 1 or greater; and preferably $0.03 \leq n/(l+m+n) \leq 0.05$, (C) a curing accelerator which is an addition product of a triphenylphosphine and p-benzoquinone, and (D) an inorganic filler which accounts for 85 to 95% by weight of the total amount of the composition, wherein preferably said curing agent (B) is contained in an amount of 1.0 to 1.4 equivalents to one equivalent of the epoxy resin (A).

It is said that, generally, the problems arise in substrate packaging when warpage of the package exceeds 150 microns, so that efforts are being made to suppress such warpage to, preferably, less than 100 microns. With the conventional technology, however, it has been difficult to hold the warpage below 100 microns in case the BGA outer shape was large.

Use of the epoxy resin composition of the present invention makes it possible to overcome the above problems.

In the present invention, an epoxy resin of the formula (1) and a curing agent of the formula (2) are used as essential components, but where necessary other epoxy resins and/or curing agents may be jointly used.

Other epoxy resins usable in the present invention are not subject to restrictions as far as they have 2 or more reactive groups in the molecule, but their ratio (equivalent percent) in the composition is preferably 10 to 40%. When their ratio is less than 10%, the effect of their use is not manifested, while when their ratio exceeds 50%, there can not be obtained satisfactory fluidity of the composition. More preferably, other epoxy resin is used in a ratio (equivalent percent) of 15 to 30%.

Other curing agents usable in this invention are also not subject to restrictions as far as they have 2 or more hydroxyl groups in the molecule, but their ratio (equivalent percent) in the composition is preferably 10 to 50%. When their ratio is less than 10%, their use effect is not recognized, while when their ratio exceeds 50%, the advantageous properties of the curing agents of the formula (2) are not manifested. More preferably, other curing agent is used in a ratio (equivalent percent) of 20 to 40%. For providing the best fluidity of the composition, the equivalent ratio of the curing agent to the epoxy resin is preferably 0.6:1~1.4:1, more preferably 0.95~1.30.

The curing agent used as component (B) is added in an amount of preferably 1 to 100 parts by weight, more preferably 5 to 95 parts by weight, per 100 parts by weight of the epoxy resin.

For the synthesis of the compounds of the formula (2), it is possible to employ, for example, the following intermolecular ring-closing reaction method comprising self oxidation of naphthol.

An incipient reaction of a phenol containing 20 to 90 mol % of a naphthol and an aldehyde is carried out with an acid catalyst in the same way as in the case of ordinary novolak resins. In case where formalin is used as the aldehyde, the reaction is conducted under reflux at a temperature of around 100° C. This reaction is continued for about one to 8 hours, and then the reaction system is heated to 120 to 180° C. while draining water from the system in the presence of a strong acid and/or a super-strong acid. This operation is carried out in an oxidizing atmosphere (e. g., in the air). 2- to 24-hour holding of this situation completes the synthesis of a compound of the formula (2). Thereafter, the unreacted monomers are removed to obtain a desired curing agent.

The naphthols usable for the synthesis include 1-naphthol, whose use is essential, 2-naphthol, 1,5-dihydroxynaphthalene, 1,6-dihydroxynaphthalene, 1,7-dihydroxynaphthalene, 2,6-dihydroxynaphthalene, and the like. These naphthols may be used in combination.

The phenols other than naphthols usable for the above synthesis include phenol and the phenol compounds commonly used for the synthesis of the phenol resins, such as o-cresol, p-cresol, m-cresol, butylphenol, dimethylphenol, nonylphenol, allylphenol and the like. These phenols may be used either singly or as a mixture of two or more of them.

The aldehydes usable for the above synthesis include those commonly used for the synthesis of phenol resins, such as formaldehyde, acetaldehyde, benzaldehyde, salicylaldehyde and the like, which may be used either singly or as a mixture of two or more of them.

Such a phenol and an aldehyde are reacted in an aldehyde to phenol molar ratio of preferably 0.3–1.0 to 1 in the presence of an acid catalyst. As the acid used as the catalyst, a weak acid such as oxalic acid, hydrochloric acid or the like is used for the incipient reaction.

The catalysts usable for the intermolecular ring-closing reaction include strong acids such as hydrochloric acid, sulfuric acid, paratoluenesulfonic acid and trifluoroacetic acid, and super-strong acids such as trifluoromethanesulfonic acid and methanesulfonic acid. These catalysts may be used either singly or as a mixture of two or more of them. The amount of the catalyst used for the reaction is preferably 0.0001 to 0.1 mole, more preferably 0.001 to 0.05 mole, per one mole of the phenol.

As the curing accelerator used as component (C), an addition product of triphenylphosphine and benzoquinone is added in an amount of preferably 0.1 to 10 parts by weight, more preferably 0.5 to 7 parts by weight, per 100 parts by weight of the epoxy resin of component (A).

The component (C) of the present invention is an adduct of a triphenylphosphine and p-benzoquinone and functions as a curing accelerator for the reaction of the epoxy resin and the compound having one or more phenolic hydroxyl groups. Production of such an adduct is not particularly limited. For example, it can be produced by dissolving a triphenylphosphine and p-benzoquinone in a suitable organic solvent, and carrying out the reaction with stirring, preferably at a temperature from room temperature to 80° C. for 1 to 12 hours. As the solvent, there can be used a solvent which can dissolve the starting materials very well but hardly dissolve the produced adduct, for example, a ketone such as methyl isobutyl ketone, methyl ethyl ketone, acetone, or the like.

The inorganic filler used as component (D) in the present invention is blended in an amount of 85 to 95% by weight based on the total amount of the composition. As for the particle shape of the filler, it is preferable that more than 50% of the particles are spherical. The type of the filler to be used in the present invention is not limited; it is possible to use, for instance, molten silica, crystal silica, alumina and the like either singly or in combination. Use of spherical molten silica is especially preferred. It is also advisable for providing good fluidity of the composition to use a filler of a constitution in which the particles with a size greater than 50 microns account for 5 to 40% of the whole filler, the particles of 12 to 50 microns account for 30 to 70% of the whole filler, the particles of 6 to 12 microns account for 5 to 30% of the whole filler, the particles of 1 to 6 microns account for 10 to 40% of the whole filler, and the particles less than 1 micron account for 1 to 20% of the whole filler.

When the amount of the filler used is less than 85% by weight, the warping tendency of the composition elevates, while when the filler amount exceeds 95% by weight, the composition tends to lack fluidity.

The coupling agent used in the present invention is not limited, but an epoxysilane, anilinosilane or the like is preferably used.

The release agent used in the present invention is also not limited; for instance, higher fatty acids such as carnauba wax and polyethylene waxes may be used singly or, preferably, jointly.

Other additives that can be used in the present invention include colorants (carbon black, etc.), modifiers (silicone, silicone rubber, etc.), and ion trappers (hydrotalcite, antimony-bismuth, etc.).

A typical method for producing a molding material using the above-shown starting materials comprises the steps of sufficiently mixing the said starting materials in the prescribed ratios by a mixer or other means, kneading the mixture by a heated roll, extruder or like means, then cooling and pulverizing it.

For encapsulating the electronic parts such as semiconductor elements with an epoxy resin composition obtained according to the present invention, a low-pressure transfer molding method is most suited, but other methods such as injection molding, compression molding, casting, etc., are also usable.

The epoxy resin composition produced by using the above-described means has excellent fluidity, moldability and warping resistance and can be used advantageously for encapsulating circuitries such as IC and LSI. It is particularly suited for application to the packages of BGA structure.

As for the adhesive for fixing the semiconductor elements on the substrate, it is possible to use all types of adhesives, such as paste adhesives and film adhesives, which are capable of fixing the semiconductor elements on the substrate. It should be noted, however, that an adhesive layer thickness on the order of 3 to 30 μm, which is employed in the ordinary practice, can not produce the desired effect of lessening warpage. It is possible to lessen warpage of the packages of BGA structure by making the adhesive layer thickness at least 50 μm, preferably 100 to 400 μm. A similar warpage lessening effect can be obtained by simply increasing the thickness of the tions were conducted at a flow rate of 1.0 ml/min, using tetrahydrofuran as mobile phase. Calibration curves were drawn using polyethylene standard sample, and the number-average molecular weight was calculated therefrom.

EXAMPLES 1–5 and COMPARATIVE EXAMPLES 1–4

In Examples 1–3 and Comparative Examples 1–4, the starting materials shown in Tables 1 and 2 were preliminarily blended (dry blended), then kneaded by a double-spindle roll (roll surface temperature: about 80° C.) for 10 minutes, then cooled and pulverized. (The compound of the formula (2) shown in the tables is the one obtained in Synthesis Example 1.)

Using the thus obtained encapsulants, the semiconductor elements were molded and subjected to the tests (on the items shown in Table 4) under the conditions of mold temperature=180° C., molding pressure=70 kgf/cm$^2$ and curing time=90 seconds, by using a transfer molding machine. The spiral flow was measured by EMMII-66. Hot hardness was measured by a Shore hardness meter. Also, using each of these encapsulants, a semiconductor element was molded by a transfer molding machine under the same conditions as described above, and after postcuring (175° C., 5 hr), moisture resistance and solder heat resistance of the element were determined.

The semiconductor device used for the moisture resistance test was a SOP-type 28-pin unit. After 72-hour moisture absorption under the conditions of 85° C. and 85 RH % semiconductor element alone, but in this case the thermal shock resistance is lowered.

The present invention is further illustrated by the following examples, which examples however are merely intended to be illustrative and not to be construed as limiting the scope of the invention in any way.

SYNTHESIS EXAMPLE 1

405 g of 1-naphthole, 298 g of phenol and 228 g of formalin were supplied into a 2-litre flask furnished with a stirrer, a condenser and a thermometer, and heated to 100° C. in an oil bath. The mixture was refluxed for one hour, inducing an incipient reaction accompanied by an exothermic reaction without a catalyst, then 2 ml of 2 N hydrochloric acid was added thereto and the mixture was reacted at the refluxing temperature of water in the system for 4 hours. Thereafter, the reaction mixture was heated to 165° C. and the reaction was further continued for 12 hours, followed by concentration under reduced pressure and removal of the unreacted phenols. The resultantly obtained resin had a number-average molecular weight of 410, a polydispersion degree of 1.58, a softening point of 90° C. and a hydroxyl equivalent of 174, and contained 6% of unreacted naphthol.

The number-average molecular weight (Mn) and the dispersion degree (Mw/Mn) were determined by Hitachi HPLC L6000 and Shimadzu Data Analyzer C-R4A, respectively. Toso G2000HXL and G3000HXL were used as GPC column for the analysis. The testing concentration was 0.2%. Determina-and a 215° C., 90-second (VPS) pretreatment, the semiconductor device was left in PCT (121° C., 2 atm.) and checked for the break or disconnection of wiring on the chips.

A 35 mm² BGA package (BT substrate: 0.6 mm thick; chip size: 12.6 mm²) was used for the determination of solder heat resistance and warpage. A film adhesive was used for fixing of the element, and its influence on warping of the package was confirmed by varying the film thickness (Table 3). Solder heat resistance was determined by the following method.

After baking at 125° C. for 24 hours, the resin-encapsulated semiconductor device was allowed to absorb moisture under the conditions of 30° C. and 70 RH % for 168 hours and then subjected to a 240° C., 10-second heat treatment, after which the semiconductor device was examined to see whether it was cracked or not.

The results of the above tests are shown collectively in Table 4.

TABLE 1

| Items | Example 1 | Example 2 | Example 3 |
|---|---|---|---|
| | (unit: parts by weight) | | |
| Epoxy resin of formula (1) (YX-4000H, produced by Yuka Shell Co., Ltd.) | 85 | 70 | 85 |
| OCN type epoxy resin (ESCN-195, produced by Sumitomo Chemical Co., Ltd.) | — | 15 | — |
| Brominated epoxy resin (ESB-400, produced by Sumitomo Chemical Co., Ltd.) | 15 | 15 | 15 |
| Curing agent of formula (2) | 93 | 92 | 80 |
| Phenolic novolak (H-1, produced by Meiwa Chemical Co., Ltd.) | — | — | 8 |
| Curing accelerator *2 | 3.0 | 3.0 | 3.0 |
| γ-glycidoxypropyl-trimethoxysilane | 7.5 | 7.5 | 7.5 |
| Carnauba wax | 1.0 | 1.0 | 1.0 |
| Polyethylene wax | 0.5 | 0.5 | 0.5 |
| Antimony trioxide | 6.0 | 6.0 | 6.0 |
| Carbon black | 3.5 | 3.5 | 3.5 |
| Spherical molten silica (average particle size: 30 μm) *1 | 2000 | 2000 | 2000 |
| Amount of filler (wt %) | 90.3 | 90.4 | 90.2 |

*1: S-COL (produced by Tatsumori. Co., Ltd.) containing approximately 20% of the particles with a size of 50 microns or more.
*2: Adduct of a triphenylphosphine and p-benzoquinone

TABLE 2

| Items | Comp. Example 1 | Comp. Example 2 | Comp. Example 3 | Comp. Example 4 |
|---|---|---|---|---|
| | (unit: parts by weight) | | | |
| Epoxy resin of formula (1) (YX-4000H, produced by Yuka Shell Co., Ltd.) | 85 | 85 | 85 | — |
| OCN type epoxy resin (ESCN-195, produced by Sumitomo Chemical Co., Ltd.) | — | — | — | 85 |
| Brominated epoxy resin (ESB-400, produced by Sumitomo Chemical Co., Ltd.) | 15 | 15 | 15 | 15 |
| Curing agent of formula (2) | 93 | 93 | — | 90 |
| Phenolic novolak (H-1, produced by Meiwa Chemical Co., Ltd.) | — | — | 56 | — |
| Curing accelerator *2 | 3.0 | — | 3.0 | 3.0 |
| Triphenylphosphine | — | 2.0 | — | — |
| γ-glycidoxypropyl-trimethoxysilane | 7.5 | 7.5 | 7.5 | 7.5 |
| Carnauba wax | 1.0 | 1.0 | 1.0 | 1.0 |
| Polyethylene wax | 0.5 | 0.5 | 0.5 | 0.5 |
| Carbon black | 3.5 | 3.5 | 3.5 | 3.5 |
| Antimony trioxide | 6.0 | 6.0 | 6.0 | 6.0 |
| Spherical molten silica (average particle size: 30 μm) *1 | 1200 | 2000 | 1650 | 1950 |
| Amount of filler (wt %) | 84.8 | 90.4 | 90.3 | 90.2 |

*1 The same as in Table 1.
*2 The same as in Table 1.

TABLE 3

| Item | Examples 1–3 | Example 4 * | Example 5 * |
|---|---|---|---|
| Thickness of film adhesive | 75 | 150 | 250 |

* The encapsulant of Examples 4 and 5 is the same as used in Example 1.

TABLE 4-1

| Items | Unit | Example 1 | Example 2 | Example 3 | Example 4 | Example 5 |
|---|---|---|---|---|---|---|
| Spiral flow | inch | 30 | 35 | 30 | 30 | 30 |
| Hot hardness | — | 80 | 85 | 85 | 80 | 80 |
| Moldability | — | OK | OK | OK | OK | OK |
| Moisture *1 | hr | 1020 | 1150 | 1330 | 1060 | 1220 |
| Solder heat resistance *2 | hr | OK | OK | OK | OK | OK |
| Warpage *3 | μm | 75 | 80 | 78 | 51 | 19 |

TABLE 4-2

| Items | Unit | Comp. Example 1 | Comp. Example 2 | Comp. Example 3 | Comp. Example 4 |
|---|---|---|---|---|---|
| Spiral flow | inch | 45 | 20 | 35 | 15 |
| Hot hardness | — | 85 | 75 | 85 | 85 |
| Moldability | — | OK | NG | OK | NG |
| Moisture resistance *1 | hr | 950 | 740 | 820 | 820 |
| Solder heat resistance *2 | hr | NG | OK | NG | NG |
| Warpage *3 | μm | 170 | 95 | 142 | 102 |

*1 The time required till percent defective of wiring reached 50%.
*2 Left under the condition of 30° C. and 60 RH % for 168 hours and infrared reflow (IRP), and check was made on peel and cracks to determine solder heat resistance.
*3 The substrate after molding was placed on a flat plate, and the difference between the lowest point and the highest point of the substrate was measured.

A molding material, or an epoxy resin composition for encapsulating semiconductor elements, having excellent moldability and reliability and minimized in susceptibility to warping can be obtained by blending a specific epoxy resin, a phenolic curing agent, a curing accelerator and a specified amount of an inorganic filler.

Using this molding material as encapsulant for the semiconductor elements, it is possible to obtain a semiconductor device having high reliability and excellent packaging workability.

What is claimed is:

1. An epoxy resin composition for encapsulating semiconductor devices, comprising:

(A) a biphenyl epoxy resin represented by the formula (1):

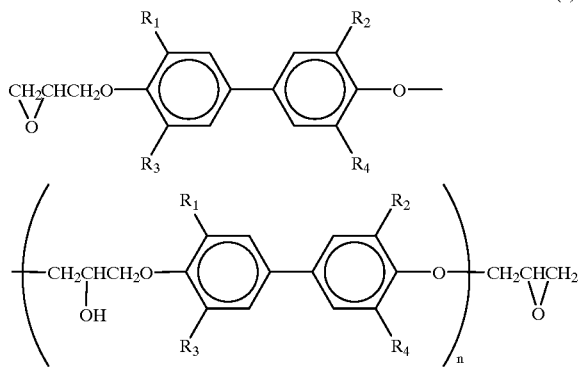

wherein n is an integer of 0 to 6; and $R_1$ to $R_4$ are the same or different and represent independently a hydrogen atom or an alkyl group having 10 or less carbon atoms;

(B) a curing agent represented by the formula (2):

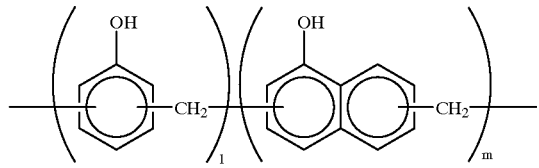

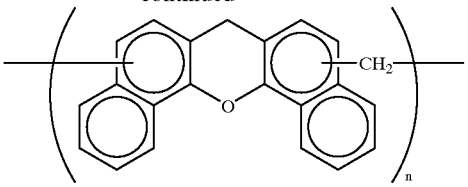

wherein l and m are each an integer of 0 or greater; and n is an integer of 1 or greater;

(C) a curing accelerator which is an addition product of a triphenylphosphine and p-benzoquinone; and (D) an inorganic filler contained in an amount of 85 to 95% by weight based on the total amount of the composition.

2. An epoxy resin composition according to claim 1, wherein the inorganic filler contains spherical molten silica in an amount of 50% by weight or more.

3. An epoxy resin composition according to claim 1, wherein the component (A) comprises 90 to 60 equivalent percent of the epoxy resin of the formula (1) and 10 to 40 equivalent percent of one or more epoxy resins having 2 or more reactive groups in one molecule.

4. An epoxy resin composition according to claim 1, wherein $0.03 \leq n/(l+m+n) \leq 0.05$.

5. An epoxy resin composition according to claim 1, wherein said curing agent (B) is included in the composition in an amount of 1.0 to 1.4 equivalents to one equivalent of the epoxy resin (A).

6. An epoxy resin composition according to claim 3, wherein the component (B) comprises 90 to 50 equivalent percent of the curing agent of said formula (2) and 10 to 50 equivalent percent of another curing agent having at least 2 hydroxyl groups in one molecule.

7. An epoxy resin composition according to claim 1, wherein the equivalent ratio of the curing agent to the epoxy resin is from 0.6:1 to 1.4:1.

8. An epoxy resin composition according to claim 1, wherein the equivalent ratio of the curing agent to the epoxy resin is 0.95 to 1.30.

9. An epoxy resin composition according to claim 8, wherein said addition product is included in the composition in an amount of 0.1 to 10 parts by weight, per 100 parts by weight of the epoxy resin.

* * * * *